United States Patent
Illegems et al.

(10) Patent No.: US 7,622,954 B2
(45) Date of Patent: Nov. 24, 2009

(54) LEVEL SHIFTER WITH MEMORY INTERFACING TWO SUPPLY DOMAINS

(75) Inventors: Paul F. Illegems, Tucson, AZ (US); Srinivas K. Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 12/037,639

(22) Filed: Feb. 26, 2008

(65) Prior Publication Data

US 2009/0212842 A1    Aug. 27, 2009

(51) Int. Cl.
*H03K 19/0175*    (2006.01)
(52) U.S. Cl. .......................................... 326/68; 326/81
(58) Field of Classification Search ............. 326/63–68, 326/80, 81
See application file for complete search history.

(56) References Cited

U.S. PATENT DOCUMENTS

| | | | |
|---|---|---|---|
| 5,825,205 A * | 10/1998 | Ohtsuka | ....................... 326/81 |
| 6,054,875 A | 4/2000 | Wayner | |
| 6,456,110 B1 | 9/2002 | Elamanchili et al. | |
| 6,842,043 B1 | 1/2005 | Nguyen et al. | |
| 7,002,371 B2 * | 2/2006 | Kase et al. | ..................... 326/68 |
| 7,199,617 B1 | 4/2007 | Schrom et al. | |
| 7,200,053 B2 | 4/2007 | Kim et al. | |
| 7,212,037 B2 | 5/2007 | Sung | |
| 7,215,173 B2 | 5/2007 | Paillet et al. | |
| 7,230,469 B2 | 6/2007 | Benzer et al. | |
| 7,245,152 B2 | 7/2007 | Wich | |
| 7,248,075 B2 | 7/2007 | Min et al. | |
| 7,248,076 B2 | 7/2007 | Chen et al. | |
| 7,265,581 B2 | 9/2007 | Yeh | |
| 7,265,582 B2 | 9/2007 | Hsu et al. | |
| 7,312,636 B2 | 12/2007 | Lines | |
| 7,317,335 B2 | 1/2008 | Min et al. | |
| 7,348,801 B2 | 3/2008 | Nojiri | |
| 7,348,813 B1 | 3/2008 | Nanda et al. | |
| 7,355,447 B2 | 4/2008 | Wood et al. | |
| 7,362,137 B2 | 4/2008 | Williams | |
| 7,362,624 B2 | 4/2008 | Sun | |
| 7,365,569 B1 | 4/2008 | Venugopal | |
| 7,368,970 B2 | 5/2008 | Lin et al. | |
| 7,372,301 B2 | 5/2008 | Fukoka et al. | |
| 7,382,158 B2 | 6/2008 | Kimura | |
| 7,385,441 B2 | 6/2008 | Liu | |
| 7,397,297 B2 | 7/2008 | Kimura | |

* cited by examiner

*Primary Examiner*—Don P Le
(74) *Attorney, Agent, or Firm*—Meyertons Hood Kivlin Kowert & Goetzel, P.C.; Jeffrey C. Hood (57) ABSTRACT

A level-shifter circuit configured to transfer data between two voltage supply domains may eliminate crowbar current while simultaneously providing a valid output signal. The level-shifter circuit may transfer a data signal between the two voltage domains using a latch that is capable of maintaining its output level—based on the destination supply rail—to correspond to the same state to which the level of the input signal—based on the originating supply rail—corresponds, even when the originating supply is decreased to a zero-volt state, or to a voltage equivalent to a low state. During normal operation, when both power supplies are available, the signal at the output of the latch, and hence at the output of the level-shifter circuit may toggle to always track the input signal. Thus, the level of the signal at the output of the level-shifter may always represent the same state (e.g. binary value) as the level of the input signal, during normal operation and also when the originating power supply is powered down.

23 Claims, 5 Drawing Sheets

LEVEL SHIFTER WITH MEMORY INTERFACING TWO SUPPLY DOMAINS

BACKGROUND OF THE INVENTION

1. Field of the Invention

This invention relates generally to the field of integrated circuit design and, more particularly, to the design of an interface circuit between two voltage supply domains.

2. Description of the Related Art

The proliferation of digital devices in everyday life has resulted in integrated circuits not only being used in computer equipment but also in a variety of other electronics systems. While most early digital equipment comprising integrated circuits relied on specific voltage levels, e.g. 5.0V at first, then 3.3V, for a number of reasons it has become desirable to further lower the supply voltage levels used in powering many of today's devices. For example, instead of using a 3.3V supply voltage to power a specific device, a lower voltage, e.g. 1.1V may be used. However, the reduction of the supply voltage levels in various systems and/or devices has not been universally implemented, and many disparate systems and/or system components are oftentimes designed to operate according to different supply voltages. For example, a microprocessor in a system may operate according to a reduced supply voltage, while other peripheral devices such as memory modules may still operate using a relatively higher supply voltage.

In general, integrated circuits (ICs) are now frequently built to operate at different supply voltage levels. For example, input/output (I/O) circuits may use higher supply voltages than circuits configured within the core of a processor. Higher supply voltages may frequently be desirable to interface properly with other system and/or circuit components. I/O pads may sometimes require higher supply voltage levels to drive heavily loaded output signals at an acceptable speed, for example. Lower supply voltage levels are typically desirable in the core of an IC to reduce power consumption and facilitate the use of smaller transistors, thereby reducing the overall die size. In certain cases, however, different voltage levels may also be applied to sections of the circuit comprised in the core. For example, when programming non-volatile memories such as programmable read-only memories in a programmable logic device, the voltage applied to the memory cells may be higher than the supply voltage used during user operation of the programmable logic device. Oftentimes, higher supply voltages may be required during power-up of a device, when the power level provided by the regular lower voltage supply might be too low for the device to properly reset itself.

In addition to lowering the overall voltage levels in ICs and various digital systems, various techniques aimed at temporarily lowering power during operation have also been introduced. Accordingly, various new modes of operation have been incorporated into multi-core processors to reduce power usage when the processor is not in full operation. For example, currently known CPU ACPI (Advanced Configuration and Power Interface) and ACPI-based low-power states (C1-C5) are very instrumental in eliminating dynamic power consumption and reducing the CPU static power. Another technique, sometimes called "drowsy mode", features leaving the power supply turned on while lowering the actual voltage level, thereby reducing the voltage gap, or voltage difference between the operating "high" and "low" levels compared to normal operation.

Figure 1:
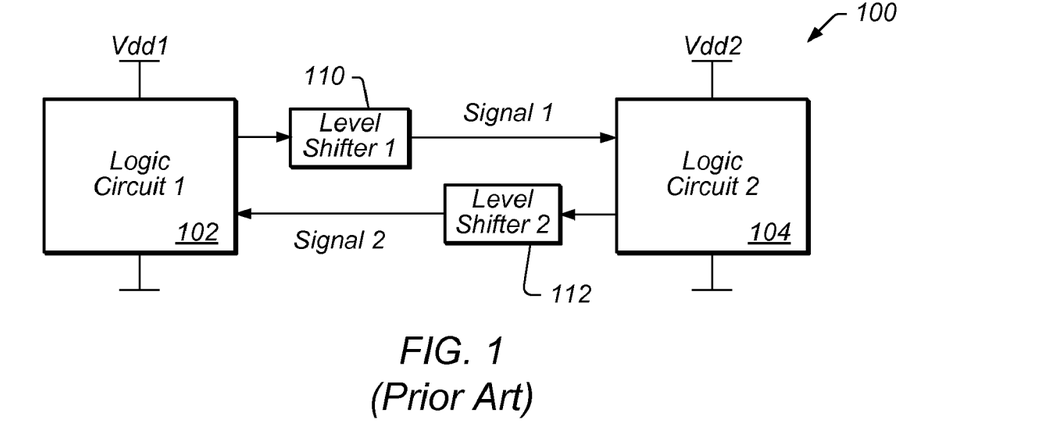
FIG. 1 shows a logic diagram for circuits in different voltage domains sharing signals using level shifters, according to prior art.
Figure 2:
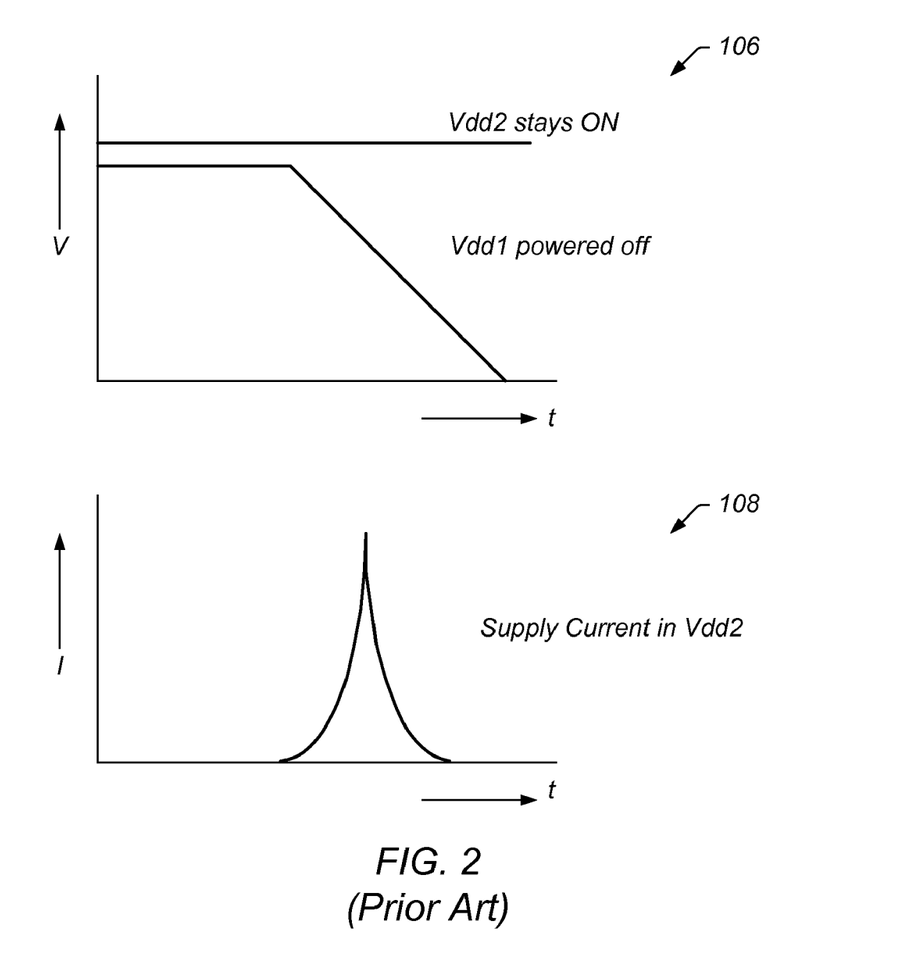
FIG. 2 shows voltage and current diagrams corresponding to the power rails shown in the logic diagram of FIG. 1, according to prior art.

Level shifter circuits have been introduced to accommodate transferring data between various supply voltage domains. However, the various different modes of operation can oftentimes pose problems and might limit the manner in which level shifters can be used. For example, it may be critical for the voltage level shifters to retain the proper state of the signals corresponding to the transferred data. Minimizing current consumption is also an important factor. FIG. 1 shows a typical configuration in which a first signal (Signal 1) is provided from logic circuit 102, operating according to a first supply voltage Vdd1, to logic circuit 104, operating according to a second supply voltage Vdd2, using a level shifter circuit 110. Similarly, another signal (Signal 2) may be provided from logic circuit 104 to logic circuit 102, using a level shifter circuit 112. FIG. 2 shows voltage and current diagrams corresponding to the power rails Vdd1 and Vdd2. If Vdd1 is powered down (turned off) while Vdd2 remains turned on, as shown in voltage graph 106, signal 1 may lose its state and become undefined. This would result from the output of level shifter circuit 110 entering an unknown state (sometimes referred to as a "floating output" or "floating signal") due to the transistors that drive the output of level shifter 110 turning off in response to losing power from Vdd1. The floating signal can cause a rather large crowbar current to flow in logic circuit 104, as shown in current graph 108. The same would hold for Signal 2 if Vdd2 were turned off and Vdd1 remained turned on, while providing Signal 2 from logic circuit 104 to logic circuit 102.

One solution for avoiding crowbar current has been the use of reset generators working in concert with the level shifter circuit. Reset generators are usually configured to trigger at a reference voltage on the falling edge of the power supply that is powered off (i.e. Vdd1 in FIG. 1), when the power supply is powered off, and register the values in the second power supply domain (i.e. in the Vdd2 domain in FIG. 1). The reset generator may be used to force the signals on the interface to zero, thereby eliminating the floating signal at the output of the level shifter circuit, and consequentially avoiding any crowbar current. One disadvantage of using a reset generator, however, is the loss of the actual state of signal 1 at the time Vdd1 is powered off.

In general, it may be beneficial to provide a simple and versatile solution to latch the digital signals when transferring data (and providing signals) from one supply domain to another supply domain, especially when one of the supply domains is powered off, while preserving the state of the signals at the interface between the logic circuits in the respective different supply domains, and simultaneously reducing or completely eliminating crowbar current. Other corresponding issues related to the prior art will become apparent to one skilled in the art after comparing such prior art with the present invention as described herein.

SUMMARY OF THE INVENTION

In one set of embodiments, a level-shifter circuit configured to transfer data between two voltage supply domains may eliminate crowbar current while simultaneously providing a valid output signal. The level-shifter may operate by transferring a data signal between the two voltage domains using a latch that is capable of maintaining its output level—based on the destination supply rail—in the same state to which the level of the input signal—based on the source supply rail—corresponds, even when the source supply is decreased to a zero-volt state, or to a voltage equivalent to a low state. During normal operation, when both power supplies are providing their full respective supply voltages, the signal at the output of the latch, and hence at the output of the level-shifter may toggle to always track the input signal. In other words, the level of the output signal may always represent the same state (e.g. data value or binary value) as the level of the input signal.

The level-shifter may have an input terminal configured to receive an input from a first voltage domain corresponding to a first supply voltage, and an output terminal configured to provide an output according to the input to a second voltage domain corresponding to a second supply voltage. The level-shifter may include a latch powered by the second supply voltage, with the output of the latch coupled to the output terminal of the level-shifter, the output of the latch in effect providing the output of the level-shifter. The level-shifter may further include a first transistor that has its channel coupled between the input of the latch and a reference voltage, and its control terminal coupled to the input terminal of the level shifter. Finally, the level-shifter may include a second transistor configured with its channel coupled between the output of the latch and the reference voltage, and its control terminal coupled to the output of an inverter that is powered by the first supply voltage, and may have its input coupled to the input terminal.

In one set of embodiments, the latch may be implemented using cross-coupled inverters, which may be realized using NMOS and PMOS devices. In another set of embodiments, the entire level-shifter circuit may be implemented as an integrated circuit having a small area, and operating with substantially zero static power dissipation. The level-shifter may therefore facilitate implementing a simple method for transferring data from a first section of a circuit (or system) powered by a first power supply to a second section of the circuit (or system) powered by a second power supply. The simple method may include receiving from the first section of the circuit (or system) a signal corresponding to the data and having a voltage level of based on the first power supply, and generating an output signal having a voltage level based on the second power supply according to the input signal. The output signal may then be provided to the second section of the circuit (or system), and may be held at a constant level even as the first power supply is powering down. The constant level may correspond to the same state to which the voltage level of the input signal corresponded at the time the first power supply began to be powered down. The method may further include resetting the output signal while powering up the first power supply and the second power supply, prior to operating the entire system.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As described herein, the terms "assertion" and "negation" relating to any timing signals may be used in a generic sense. More particularly, these terms may be used to avoid confusion when working with a combination of "active-low" and "active-high" signals, and to represent the fact that alternate embodiments to the embodiments presented herein should not be assumed to be limited to the illustrated/described signals. Those skilled in the art will appreciate that alternate embodiments may be implemented by completely or partially reversing the assertion level of any or all signals, thereby reassigning the "active-low" and "active-high" designation of those signals through a simple logic circuit change. In addition, the terms "assert", "assertion" and "asserted" indicate that a signal is active independent of whether that level is represented by a high or low voltage, while the terms "negate", "negated" and "negation" indicate that a signal is inactive.

Logic levels, or states, such as "1" and "0" may be represented by any specified respective voltage levels. For example, a "0" may be represented by a low voltage (a voltage residing in a low state), which may range from 0V to a specified maximum voltage (sometimes in the few hundred mV-range), while a "1" may be represented by a high voltage (voltage residing in a high state), which may be equivalent to the value of a supply voltage, or a specified minimum voltage within a certain range of the supply voltage. Accordingly, a logic value of "1" for a given signal may be represented by different respective voltages in different supply voltage domains. For example, if the supply voltage is 1.9V, a logic "1" might be represented by 1.9V, or a specified minimum voltage within a specified range from 1.9V, while a supply voltage of 1.5V may lead to a logic "1" being represented by 1.5V, or a specified minimum voltage within a specified range from 1.5V. Furthermore, any signal state may be similarly represented by a voltage value or a range of voltage values in various voltage domains, as based on the respective values of the supply voltages in the different voltage domains. Accordingly, each signal state may have a respective corresponding voltage value or range of voltage values within each voltage domain, and though the actual voltage values across the different voltage domains may be different, they may each, within their respected voltage domain, correspond to the same signal state.

It should further be noted that holding a signal or voltage in a "constant state" is not to be interpreted to literally mean that the physical voltage, or voltage level of the signal is at all times constant, although "constant state" would also refer to such cases, but rather that the physical voltage, or voltage level of the signal remains within a specified range corresponding to a state of the signal recognized by the system as being constant. For example, holding a signal in a "constant high state" indicates that the physical voltage level of the signal remains within a range specified as the range that corresponds to what the system recognizes as a constant "high state" for that signal. Those skilled in the art will appreciate that holding a signal (or input or output) in a constant state (or at a constant level) generally references holding that signal (or input or output) at a physical voltage level recognized by the system as being representative of the signal remaining in the same state.

Figure 3:
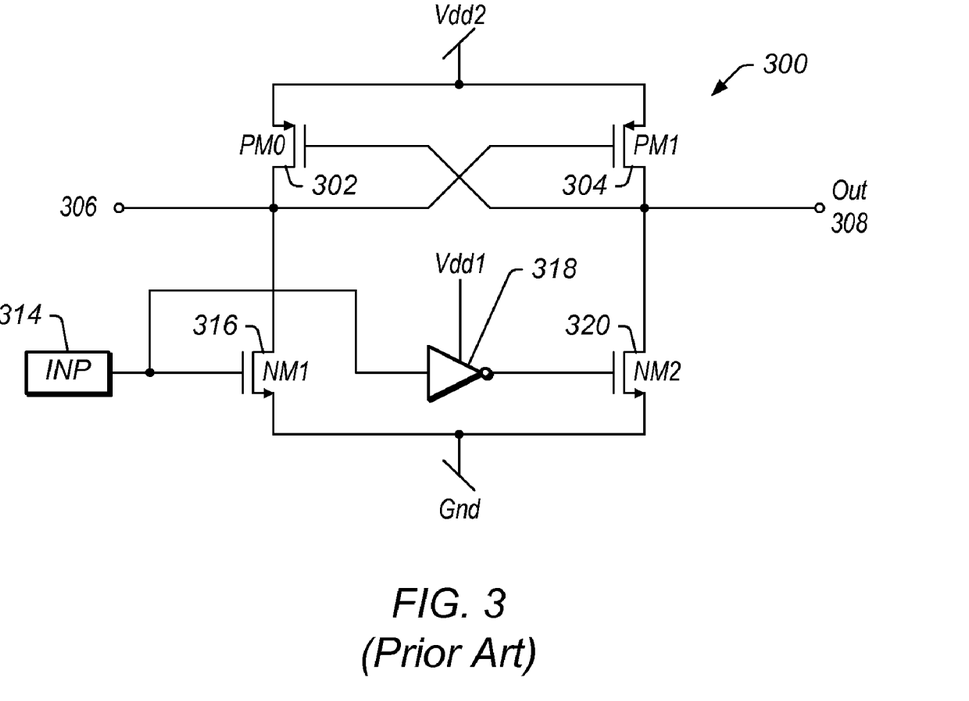
FIG. 3 shows one embodiment of a level-shifter that is prone to developing crowbar current.

FIG. 3 shows one embodiment of a level-shifter circuit (LSC) 300 that is prone to losing its output state when Vdd1 is powered down, and causing crowbar current. For this embodiment, LSC 300 may be assumed to be configured between logic circuits 102 and 104, operating according to supply voltages Vdd1 and Vdd2, respectively, and transferring data through a signal line from a voltage domain operating according to Vdd1 to a voltage domain operating according to Vdd2. LSC 300 may receive an input signal 314 from the voltage domain operating according to Vdd1, and may shift a level of input signal 314 to produce an output signal 308 corresponding to the same state (e.g. same binary value but at a different voltage level) as input signal 314, but based on Vdd2. For example, input signal 314 may contain a digital bit from a logic circuit (e.g. logic circuit 102 in FIG. 1) using a higher-voltage level signal (e.g. based on Vdd1 as shown in FIG. 1). Input signal 314 may be inverted by inverter 318, which is powered by Vdd1, and may be provided to the gate of NMOS device 320. Input signal 314 may at the same time be applied to the gate of NMOS device 316. The gates of NMOS devices 316 and 320 may operate in response to these signals, which are complements of each other. Accordingly, during normal operation only one of NMOS devices 316 and 320 may be turned on at a time. One channel terminal (in this case the source terminal) of each of NMOS devices 316 and 320 may be connected to a reference voltage, which may be at a zero voltage level, or ground, as shown in FIG. 3. The NMOS device which is turned on may thus connect the node to which it is attached on its other channel terminal (in this case its drain terminal) to the zero voltage level, or ground. The nodes 306 and 308 may be cross-coupled to the respective gate terminals of PMOS devices 304 and 302, as shown.

Operation of LSC 300 may further be described as follows. For a high input signal, that is, when input signal 314 is at a high voltage, transistor 316 may initially be turned on, and transistor 320 may be turned off. This would result in the signal at node 306 residing at a low level, which in turn would result in transistor 304 turning on, and pulling the output node 308 to high level. However, when supply voltage Vdd1 is turned off (e.g. when powering down the power supply that provides Vdd1), input signal 314 would also transition from a high state to a low state as Vdd1 is decreasing, even though the original state of input signal 314 was high, and was not meant to transition to a low state. This would result in both transistors 316 and 320 turning off, since inverter 318, which is powered by the Vdd1 rail and has its output configured to control the gate of transistor 320, is turned off, resulting in a floating and undefined signal at either node 306 or node 308. As a result of an undefined (floating) signal at either node 306 or node 308, LSC 300 may cause a large crowbar current in the active circuit driven by node 308. In addition, a floating (undefined) signal at node 306 and/or node 308, respectively, would also result in the output signal at node 308 no longer representing the original state of input signal 314, hence an invalid signal would be produced at output node 308.

In one set of embodiments, the crowbar current may be eliminated while simultaneously providing a valid output signal, by transferring the signal between the two voltage domains (Vdd1 and Vdd2) using a latch that is capable of maintaining its output level—based on the Vdd2 supply rail—at a level corresponding to the same state to which the level of the input signal—based on the Vdd1 supply rail—corresponds, even when Vdd1 is decreased to 0V, or to a voltage equivalent to a low state. During normal operation, when both power supplies are providing their full respective supply voltages (Vdd1 and Vdd2, respectively), the latch may be operable to toggle its output signal to always follow the input signal. In other words, the level of the output signal may always represent the same state (e.g. data value or binary value) as the level of the input signal.

Figure 4:
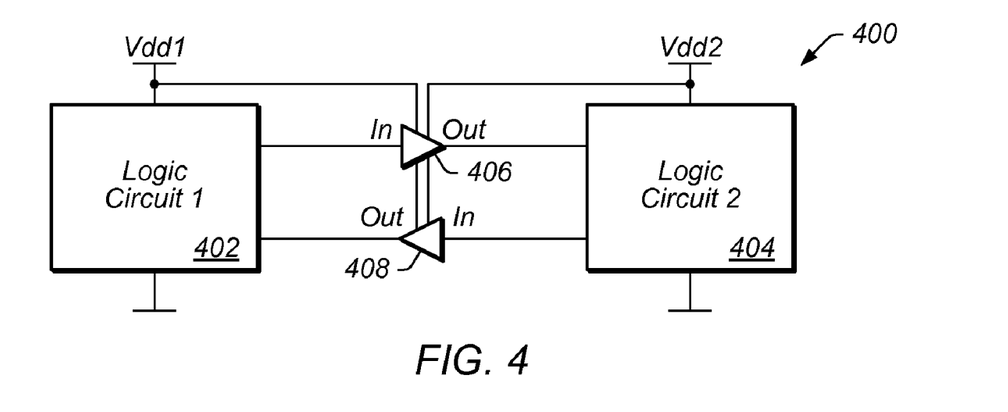
FIG. 4 shows one embodiment of a system for transferring data between logic circuits operating according to different supply voltages.

FIG. 4 shows one embodiment of a system for transferring data between logic circuit 402 operating according to a first supply voltage (Vdd1), and logic circuit 404 operating according to a second supply voltage (Vdd2), using interface device (or circuit) 406 (e.g. a level-shifter circuit) for transferring data from logic circuit 402 to logic circuit 404, and using interface device (or circuit) 408 for transferring data from logic circuit 404 to logic circuit 402. As indicated in FIG. 4, interface devices (e.g. level-shifter circuits) 406 and 408 may each be powered by both Vdd1 and Vdd2, as will be further explained below. It should be noted that while the embodiment shown in FIG. 4 specifically identifies logic circuits 404 and 402, which are powered by different respective power supplies, the interface devices 406 and 408 may equally be used to transfer signals and/or data between different systems, between different parts of a same system, between sub-circuits within a given circuit, or in general between different voltage domains representing different supply levels and/or supply voltages.

Figure 5:
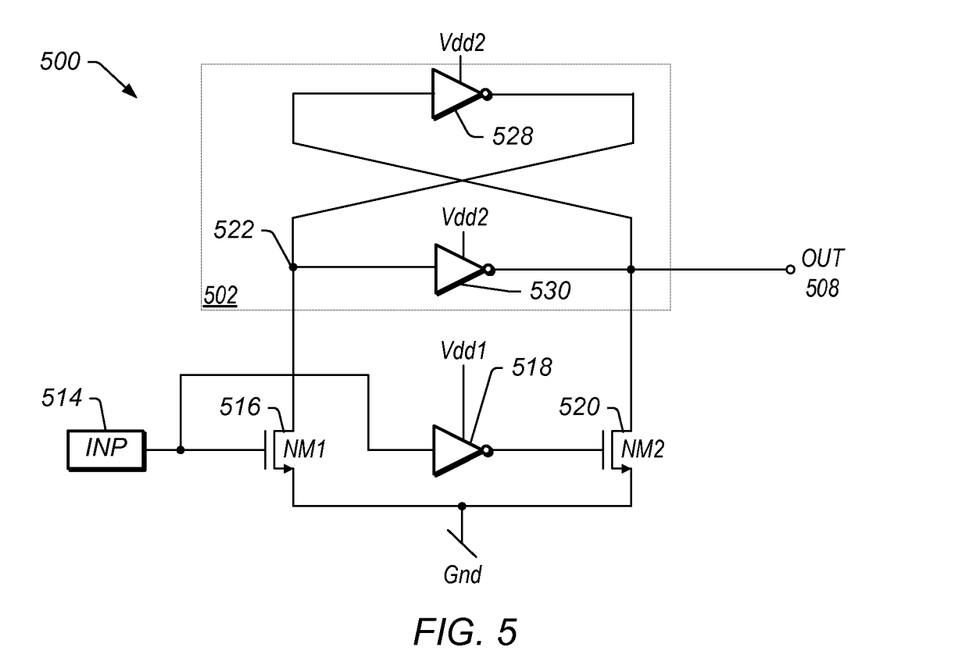
FIG. 5 shows a logic circuit of one embodiment of a level-shifter that eliminates crowbar current while retaining a state of the transferred signal.

FIG. 5 shows one embodiment of an interface device (or circuit) that may be used to transfer signals and/or data between different voltage domains. The embodiment shown in FIG. 5 may be referred to as a level-shifter circuit (LSC). LSC 500 may eliminate crowbar currents, while retaining at output 508 the state of the transferred signal received at input node 514. LSC 500 may be used to implement interface devices (e.g. level-shifters) 406 and 408 in FIG. 4. Consequently, the supply voltages, as designated in FIG. 5, may need to be switched when transferring data in an opposite direction. The configuration shown in FIG. 5 is for a data signal transfer from the Vdd1 domain to the Vdd2 domain. Accordingly, a configuration for data signal transfer from the Vdd2 domain to the Vdd1 domain may be implemented by re-coupling the supply voltages in FIG. 5, to have inverter 518 powered by Vdd2, and inverters 528 and 530 powered by Vdd1.

The overall structure of LSC 500 may be looked at in two possible ways. LSC 500 may be considered as an interface device containing a first circuit powered by Vdd2, in this case comprising inverters 528 and 530, and transistor devices 516 and 520, and a second circuit powered by Vdd1, in this case comprising inverter 518. The first circuit may operate to control the output node OUT 508 (the output of interface device 500) according to the input INP 514, with the second circuit operating to control a portion of the first circuit (specifically transistor device 520, in this case) also according to the input INP 514. As shown in FIG. 5, the overall structure of LSC 500 may also be considered as comprising a functional latch 502, in this case formed by inverters 528 and 530, with a designated input at node 522 and a designated output at node 508, and powered by a first supply voltage, in this case Vdd2 corresponding to the destination supply domain. A control circuit, in this case comprising transistor devices 516 and 520, and inverter 518, may be coupled to latch 502 at input node 522 and output node 508 to control input 522 and output 508 of latch 502 according to input signal INP 514. A section of the control circuit that is configured to control output 508 of latch 502, in this example inverter 518, may be powered by a second supply voltage, in this case Vdd1 corresponding to the source supply domain. Those skilled in the art will appreciate that other embodiments of latches operating in accordance with the operation of latch 502 are possible and may be contemplated.

The operation of LSC 500 will now be described for the case when input signal 514 is at a high voltage level (which may correspond to a high state or a logic value of "1") when Vdd1 is powered off while Vdd2 remains on. When both Vdd1 and Vdd2 are providing full power, a high voltage (corresponding in this case to logic "1") at input 514 may turn on NMOS device 516, resulting in a low voltage at node 522. The low voltage at node 522 may be inverted by inverter 530 to produce a high voltage at output node 508. Since the high input voltage at input 514 is inverted by inverter 518, NMOS device 520 may be turned off, leaving the high voltage at output node 508 unaffected. Because the output of inverter 530 is coupled to the input of inverter 528, and the output of inverter 528 is coupled to the input of inverter 530, the high voltage level may be latched at output node 508, which in turn may latch the low voltage level at node 522. Thus, even when the voltage level at input 514 begins to decrease as a result of voltage supply Vdd1 being turned off, the established voltage levels may remain unchanged at node 522 and at output node 508. Because the voltage at input 514 decreases as a result of Vdd1 being turned off, not as a result of its undergoing a proper change in signal state, inverter 518 may become inoperational at this time, and the input at the gate terminal of NMOS device 520 may thus remain at a low voltage level, keeping NMOS device 520 turned off, thereby leaving the high voltage level at output 508 unaffected.

Figure 6:
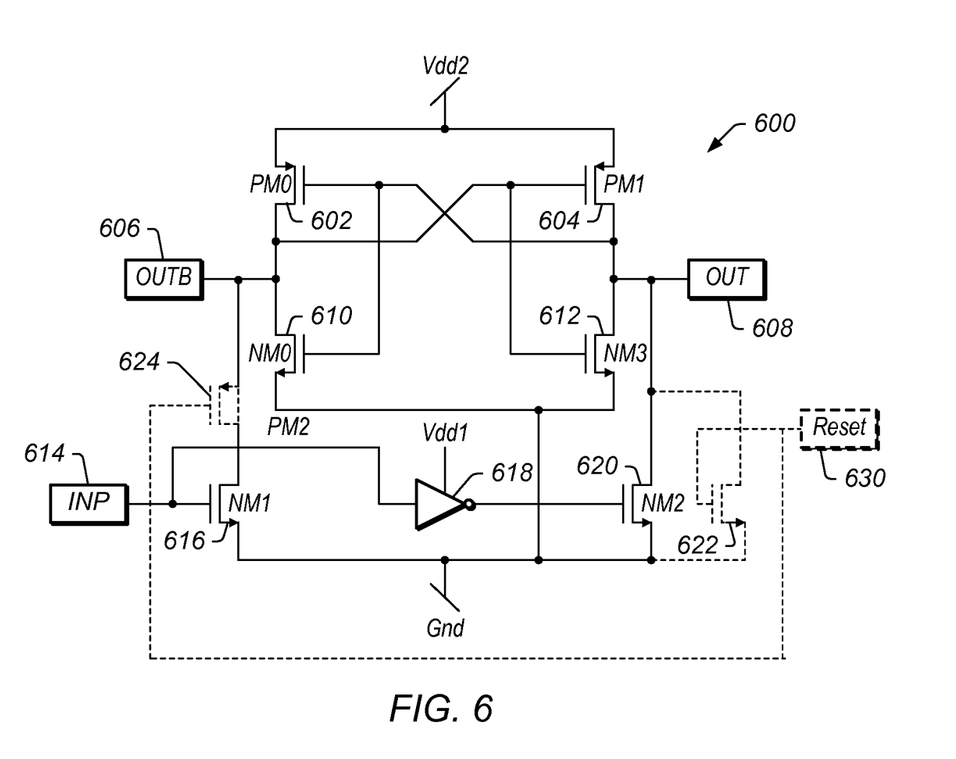
FIG. 6 shows a circuit diagram of one embodiment of the level-shifter circuit of FIG. 5.

In one set of embodiments, LSC 500 may be implemented using CMOS devices as shown in FIG. 6. For the circuit shown in FIG. 6, when both Vdd1 and Vdd2 are providing full power, a high voltage (corresponding in this case to logic "1") at input 614 may turn on NMOS device 616, resulting in a low voltage at OUTB 606. The signal at OUTB 606 may be used to drive NMOS device 612, thus a low voltage at OUTB 606 may turn NMOS device 612 off. At the same time, the signal at OUTB 606 may also be used to drive PMOS device 604, thus a low voltage at OUTB 606 may turn PMOS device 604 on. This combination may result in a high voltage developed at OUT 608, thereby matching the high voltage at input 614, now based on Vdd2, however, and not on Vdd1. In turn, the signal at OUT 608 may be used to drive PMOS device 602 and NMOS device 610. A high voltage at OUT 608 may therefore operate to turn PMOS device 602 off and NMOS device 610 on, reinforcing the low voltage level, (in other words pulling the voltage low) at OUTB 606. Since the high input voltage at input 614 may be inverted by inverter 618, NMOS device 620 may be turned off, leaving the high voltage at output node 508 unaffected (in other words pulled high).

Therefore, even when the voltage level at input 614 begins to decrease as a result of voltage supply Vdd1 being turned off, the established voltage levels may remain unchanged at OUTB 606 and OUT 608. Again, because the voltage at input 614 decreases as a result of Vdd1 being turned off, not because of the signal undergoing a proper change in its signal state, inverter 618 may become inoperational at this time because it is powered by Vdd1, and the input at the gate terminal of NMOS device 620 may thus remain at a low voltage level, keeping NMOS device 620 turned off, thereby leaving the high voltage level at OUT 608 unaffected.

The operation of LSC 500 and the circuit embodiment 600 may similarly be examined for the case when input signal 514 (in FIG. 5) and input signal 614 (in FIG. 6) is at a low voltage level (which may correspond to a low state or a logic value of "0") when Vdd1 is powered off while Vdd2 remains on. Turning again to FIG. 6, in this case the voltage level at input 614 may remain low, resulting in NMOS device 616 being turned off, and NMOS device 620 being turned on until Vdd1 has dropped off below the transistor threshold $V_T$. The voltage level at OUT 608 may remain low, turning PMOS device 604 on, which in turn may raise the voltage level at OUTB 606 to high. NMOS devices 610 and 612 may maintain the state of the level shifter while both NMOS devices 616 and 620 are off in the absence of Power Supply Vdd1, which at this time may no longer be powering inverter 618. Thus, the voltage level at OUT 608 may remain at a low level based on Vdd2, corresponding to the low voltage level initially based on Vdd1 at input 614. In other words, the state of OUT 608 may match the proper state in which input 614 was residing before Vdd1 was powered down (turned off), even while Vdd1 is powered down.

Still referring to FIG. 6, during normal operation, when both Vdd1 and Vdd2 are available, if input 614 goes high, it may turn on NMOS device 616, while the inverted input at the output of inverter 618 may turn off NMOS device 620. The low voltage thereby developed at OUTB 606 may turn off PMOS device 604, pulling OUT 608 to a high level, which may operate to retain the latched levels at OUTB 606 and OUT 608. When input 614 goes low, NMOS device 616 may be turned off, while the inverted input at the output of inverter 618 may turn on NMOS device 620, pulling OUT 608 low, and hence pulling OUTB 606 high by turning on PMOS device 602. Again, the established voltage levels may remain latched as a result of the signal at OUTB 606 controlling PMOS device 604 and NMOS device 612, and the signal at OUT 608 controlling PMOS device 602 and NMOS device 610.

In one set of embodiments, all the NMOS devices may have equal strength $\beta_N$, while PMOS devices 602 and 604 may be made weaker ($\beta_P < \beta_N$). Furthermore, as shown in FIG. 6, some embodiments may include a reset switch/circuit to reset OUT 608 when both power supplies are powering up, that is, when the system is powered up. For example, NMOS device 622 may have its channel coupled across the channel of NMOS device 620, with its gate terminal configured to receive a reset signal, while PMOS device 624 may have its channel coupled between the drain terminal of NMOS device 616 and OUTB node 606, with its gate terminal also configured to receive a reset signal. When the reset signal 630 is asserted, as the power supply providing Vdd2 is powered up, NMOS device 622 may eventually turn on, while PMOS device 624 may remain turned off, forcing OUT 608 to a low level (and forcing OUTB 606 to a corresponding high level). Once both power supplies are available, reset signal 630 may be de-asserted, thereby turning off NMOS device 622, and allowing OUT 608 to change states according to the operation of LSC 600.

It should be noted that the analysis presented above could be equally applied to an input received by LSC 500 (or by LSC 600) from any first voltage domain to be transmitted or provided to any other voltage domain. Those skilled in the art will appreciate that in the embodiments shown in FIG. 5 and FIG. 6, the supply voltage corresponding to the first voltage domain, or a supply voltage having the same value as the supply voltage corresponding to the first voltage domain may be used to power inverter 518 (in FIG. 5) and inverter 618 (FIG. 6), while the supply voltage corresponding to the other (target) voltage domain, or a supply voltage having the same value as the supply voltage corresponding to the target voltage domain may be used to power the remaining portion of the circuit (e.g. inverters 528 and 530, and NMOS devices 516 and 520 in FIG. 5, and PMOS devices 602 and 604, and NMOS devices 610, 612, 616, and 620 in FIG. 6).

Figure 7:
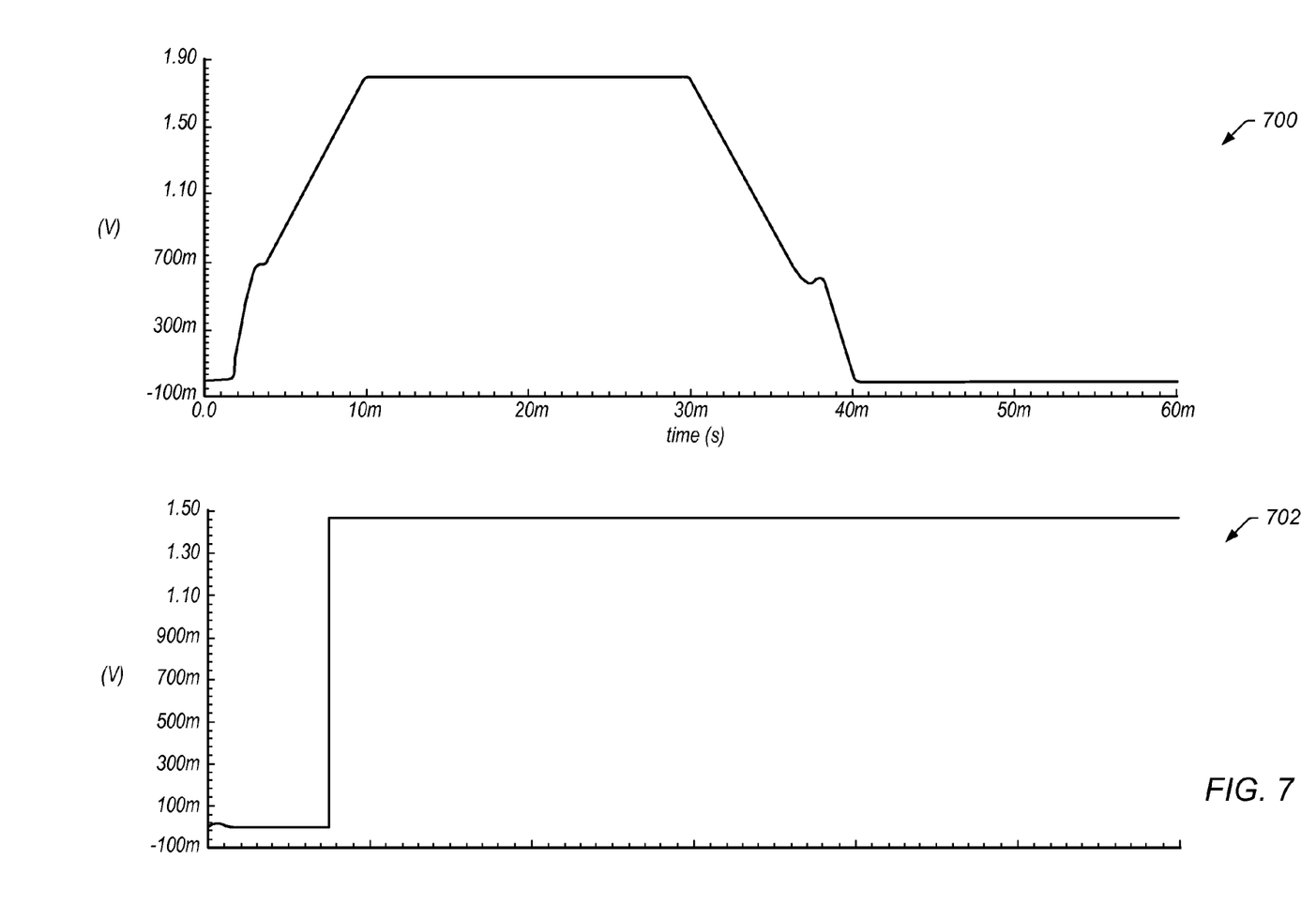
FIG. 7 shows respective voltage diagrams of the input voltage and the output voltage for one embodiment of a level-shifter, when a high input signal is forced to transition to a reference level as the supply voltage of the circuit sourcing the data signal is turned down.
Figure 8:
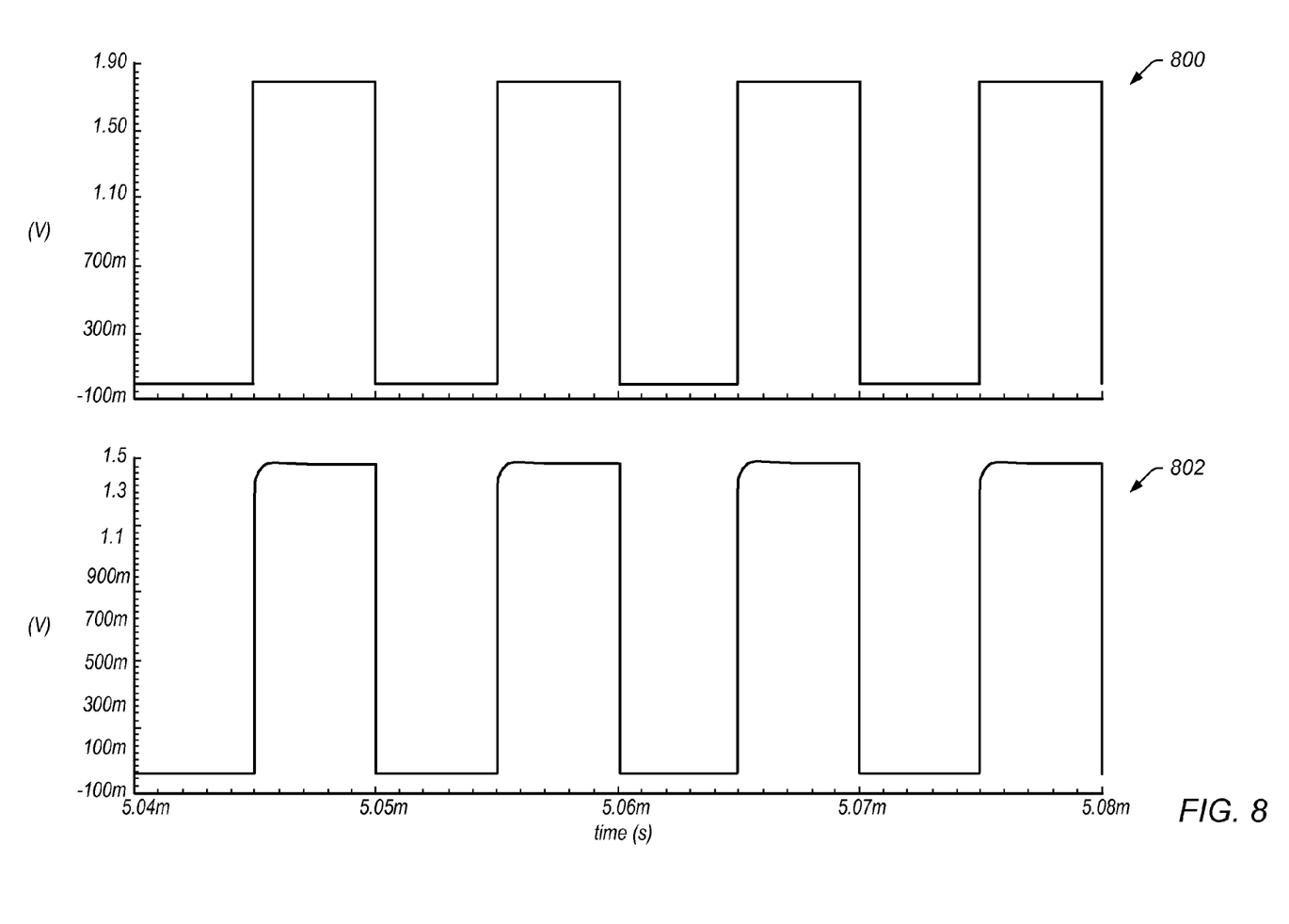
FIG. 8 shows respective voltage diagrams of the input voltage and the output voltage for one embodiment of a level-shifter during normal operation, when the supply voltage of the circuit sourcing the data signal and the supply voltage of the circuit receiving the data signal are both at normal operating levels.

FIG. 7 shows simulation results of the input signal (e.g. input 614 in FIG. 6) represented by voltage signal 700, and the corresponding output signal (e.g. OUT 608 in FIG. 6) represented by voltage signal 702 for one embodiment of a level-shifter, when a high input signal is forced to transition to a reference level as the supply voltage of the circuit sourcing the data signal is turned down. As shown in FIG. 7, while input voltage 700 transitions to a low state due to the supply voltage being powered down, the state of the output voltage 702 remains the same, at a high level. The state of the input signal 700 is thus preserved in output signal 702. In a similar manner, FIG. 8 shows simulation results of the input signal represented by voltage signal 800, and the corresponding output signal represented by voltage signal 802 during normal operation when both power supplies are on, and available. As shown in FIG. 8, the output voltage 802 tracks the input voltage 800. In both FIG. 7 and FIG. 8, the example used for Vdd1 is 1.8V, and the example used for Vdd2 is 1.5V.

Some of the advantages of level-shifter circuits designed according to principles of the present invention include the overall absence of crowbar current when turning off either one of the power supplies, prevention of crowbar current in the logic driven by the output of the level-shifter circuit, and the ability to register the signals in the absence of one of the power supplies. In addition, some embodiments of the level-shifter circuits may be implemented as integrated circuits having a small area, and operating with substantially zero static power dissipation.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A circuit for transferring data between two supply voltage domains, the circuit comprising:
   an input terminal configured to receive an input signal corresponding to the data from a first system operating according to a first supply voltage;
   an output terminal configured to provide an output signal corresponding to the data based on the input signal to a second system operating according to a second supply voltage;
   a first circuit powered by the second supply voltage, and configured to receive the input signal and generate the output signal according to the input signal;
   a second circuit powered by the first supply voltage and configured to receive the input signal and control at least a first section of the first circuit according to the input signal; and
   a reset circuit coupled to the output terminal and configured to receive a reset signal, wherein the reset circuit is operable to reset the output signal of the circuit when the reset signal is asserted;
   wherein the first circuit is operable to hold the output signal in a constant state as the first supply voltage is powered off from a nominal value to a low-power value.

2. The circuit of claim 1, wherein in holding the output signal in a constant state as the first supply voltage is powered off, the first circuit is operable to hold the output signal in:
   a high state if the input signal is in a high state at a time the first supply voltage is powered off; and
   a low state if the input signal is in a low state at a time the first supply voltage is powered off.

3. The circuit of claim 1, wherein the data is either a logic "1" or a logic "0".

4. The circuit of claim 1, wherein the first circuit is operable to generate the output signal to have a same state as the input signal, when the first supply voltage and the second supply voltage are both on.

5. A method for providing a first signal from a first section of a circuit powered by a first power supply to a second section of the circuit powered by a second power supply, the method comprising:
   receiving the first signal from the first section of the circuit, wherein a level of the first signal is based on the first power supply;
   generating a second signal according to the first signal, wherein a level of the second signal is based on the second power supply;
   providing the second signal to the second section of the circuit;
   holding the second signal at a constant level while powering down the first power supply.

6. The method of claim 5, further comprising resetting the second signal while powering up the first power supply and the second power supply, prior to said receiving, said generating, said providing and said holding.

7. The method of claim 5, wherein said holding the second signal at a constant level comprises holding the second signal at a level corresponding to a same state to which the level of the first signal corresponds.

8. The method of claim 5, wherein said generating the second signal comprises generating the second signal to have a level corresponding to a same state to which the level of the first signal corresponds.

9. The method of claim 8, wherein said generating the second signal to have a level corresponding to a same state to which the level of the first signal corresponds is performed when both the first power supply and the second power supply are on.

10. A level shifter comprising:
    an input terminal configured to receive an input from a first voltage domain corresponding to a first supply voltage;

an output terminal configured to provide an output according to the input to a second voltage domain corresponding to a second supply voltage;

a latch powered by the second supply voltage and having an input, and having an output coupled to the output terminal;

a first transistor having a channel coupled between the input of the latch and a reference voltage, and having a control terminal coupled to the input terminal;

a second transistor having a channel coupled between the output of the latch and the reference voltage, and having a control terminal;

an inverter powered by the first supply voltage and having an input coupled to the input terminal, and having an output coupled to the control terminal of the second transistor; and a reset circuit coupled to the output terminal and configured to receive a reset signal, wherein the reset circuit is operable to reset the output of the level-shifter when the reset signal is asserted.

11. The level shifter of claim 10, wherein the latch comprises:

a first inverter having an input and an output;

a second inverter having an input configured as the input of the latch and coupled to the output of the first inverter, and having an output configured as the output of the latch and coupled to the input of the first inverter.

12. The level-shifter of claim 11, wherein the first inverter and the second inverter comprise MOS (metal-oxide semiconductor) devices.

13. The level-shifter of claim 10, wherein the level shifter is an integrated circuit.

14. The level-shifter of claim 10, wherein the reset circuit comprises:

a third transistor having a channel coupled between the output terminal and the reference voltage, and having a control terminal configured to receive the reset signal; and a fourth transistor having a channel coupled between the input of the latch and the channel of the first transistor, and having a control terminal configured to receive the reset signal.

15. A system comprising:

a first circuit powered by a first supply voltage and having an input and an output;

a second circuit powered by a second supply voltage and having an input and an output;

an interface circuit having a first input coupled to the output of the first circuit, a second input coupled to the output of the second circuit, a first output coupled to the input of the second circuit, and second output coupled to the input of the first circuit, wherein a first section of the interface circuit is powered by the first supply voltage and a second section of the interface circuit is powered by the second supply voltage;

wherein the interface circuit is operable to transfer data from the first circuit to the second circuit through the first input and the first output, and transfer data from the second circuit to the first circuit through the second input and the second output;

wherein the interface circuit is operable to:

maintain at the first output a signal level corresponding to a state of the first input representative of the data, even when the first supply voltage is powered off; and maintain at the second output a signal level corresponding to a state of the second input representative of the data, even when the second supply voltage is powered off.

16. The system of claim 15, wherein the interface circuit comprises:

a first level-shifter having an input stage comprising an input configured as the first input of the interface circuit, and having an output stage powered by the second supply voltage and comprising an output configured as the first output of the interface circuit, wherein a section of the input stage of the first level-shifter configured to control the output of the first level-shifter is powered by the first supply voltage; and a second level-shifter having an input stage comprising an input configured as the second input of the interface circuit, and having an output stage powered by the first supply voltage and comprising an output configured as the second output of the interface circuit, wherein a section of the input stage of the second level-shifter configured to control the output of the second level-shifter is powered by the second supply voltage.

17. A system comprising:

a latch powered by a first supply voltage and having an input and an output;

a control circuit coupled to the latch and configured to receive an input signal, and further configured to control the input of the latch and the output of the latch according to the input signal, wherein a section of the control circuit which is configured to control the output of the latch is powered by a second supply voltage; and a reset circuit operable to reset the output of the latch while the first power supply and the second power supply are powering up;

wherein an output signal generated at the output of the latch in response to the input signal remains at a level corresponding to a state of the input signal even when the second supply voltage is powered down.

18. The system of claim 17, wherein the latch comprises:

a first transistor and a second transistor having their respective channels coupled in series between the first supply voltage and a reference voltage, and having their control terminals coupled together and configured as the output of the latch; and a third transistor and a fourth transistor having their respective channels coupled in series between the first supply voltage and the reference voltage, and having their control terminals coupled together and configured as the input of the latch;

wherein the output of the latch is coupled to a common node coupling the channel of the third transistor to the channel of the fourth transistor, and the input of the latch is coupled to a common node coupling the channel of the first transistor to the channel of the second transistor.

19. The system of claim 18, wherein the first transistor and the third transistor are PMOS devices, and the second transistor and the fourth transistor are NMOS devices.

20. The system of claim 17, wherein the control circuit comprises:

a first transistor having a channel coupled between the input of the latch and a reference voltage, and having a control terminal configured to receive the input signal;

a second transistor having a channel coupled between the output of the latch and the reference voltage, and having a control terminal;

wherein the section of the control circuit which is configured to control the output of the latch comprises an inverter powered by the second supply voltage, wherein the inverter has an input configured to receive the input signal, and has an output coupled to the control terminal of the second transistor.

21. The system of claim 20, wherein the first transistor and the second transistor are NMOS devices.

22. The system of claim 17, further comprising
a first power supply configured to generate the first supply voltage; and
a second power supply configured to generate the second supply voltage.

23. The system of claim 17, wherein the system is an integrated circuit.

* * * * *